(12) United States Patent
Pickard et al.

(10) Patent No.: US 6,522,147 B1
(45) Date of Patent: Feb. 18, 2003

(54) LED TEST SWITCH AND MOUNTING ASSEMBLY

(75) Inventors: Paul Kenneth Pickard, Conyers, GA (US); Edward Roger Adams, Englewood, TN (US)

(73) Assignee: Acuity Brands, Inc., Atlanta, GA (US)

( * ) Notice: Subject to any disclaimer, the term of this patent is extended or adjusted under 35 U.S.C. 154(b) by 0 days.

(21) Appl. No.: 09/865,913

(22) Filed: May 24, 2001

(51) Int. Cl.[7] .................. G01R 31/00; H05B 41/14; H01H 9/00
(52) U.S. Cl. ................ 324/414; 315/86; 200/314
(58) Field of Search .................. 324/414, 410, 324/403, 536; 315/86, 307, 224; 15/250.454; 362/295; 363/49; 320/127; 200/314

(56) References Cited

U.S. PATENT DOCUMENTS

| | | | |
|---|---|---|---|
| 4,686,424 A | * 8/1987 | Nuckolls et al. | 315/86 |
| 4,993,103 A | * 2/1991 | Takahashi et al. | 15/250.454 |
| 5,202,608 A | * 4/1993 | Johnson | 307/44 |
| 5,392,202 A | * 2/1995 | Herron | 200/314 |
| 5,814,971 A | * 9/1998 | Johnson | 315/86 |

* cited by examiner

*Primary Examiner*—Christine Oda
*Assistant Examiner*—James Kerveros
(74) *Attorney, Agent, or Firm*—Kenneth E. Darnell (57) ABSTRACT

A manually operable test switch useful for testing of inverter units installed in fluorescent lighting fixtures, the inverter units providing an emergency lighting capability to the lighting fixtures on interruption of usual mains AC power and the test switch providing an ability to test the condition of the inverter units during normal maintenance activity. Operation of the test switch shorts an LED carried by a housing of the switch, the housing also being formed integrally with an adjustable toothed connector for mounting the test switch to a portion of the lighting fixture. The switch housing mounts an electrical contact element under spring loading from a resilient bushing, the contact being displaceable against the spring loading by manual manipulation of an electrical circuit which includes the inverter unit so that the LED is shorted and lamping driven under normal conditions is illuminated at reduced levels to prove functional use of the lamping and associated circuitry of the inverter unit for worthiness to function on loss of usual AC mains power.

41 Claims, 4 Drawing Sheets

LED TEST SWITCH AND MOUNTING ASSEMBLY

BACKGROUND OF THE INVENTION

1. Field of the Invention

The invention relates to test switch and pilot light structures generally and particularly to a test switch/pilot light having a light emitting diode which is shorted by a switch, lamping of an emergency fluorescent lighting fixture or the like providing illumination at reduced levels, thereby to test visually the operational worthiness of an inverter unit.

2. Description of the Prior Art

Fluorescent lighting fixtures of various description including such fixtures generally known as linear fixtures and downlighting fixtures can be provided with battery packs and associated circuitry which operate fluorescent lamping of the fixtures for a minimum period of time on interruption of normal power. Such devices are generally referred to as inverter units, battery/inverter units, or battery/charger board units and will be referred to herein as an inverter unit. Units with which the present test switch can be employed also include ballast load transfer devices and the like which do not include batteries. The present test switch can be used as a remote test switch with any number of emergency lighting fixtures. Present day inverter units often carry maintenance-free, high-temperature nickel-cadmium batteries within sealed housings formed of high impact polycarbonate polymers or steel. Such inverter units are described, for,.example, in U.S. Pat. Nos. 5,202,608 and 5,814,971. Lithonia Lighting, a division of National Service Industries, Inc., of Atlanta, Ga., manufactures and markets inverter units of this type under the POWER SENTRY trademark for particular use with linear fluorescent fixtures and downlighting fluorescent fixtures and particularly such fixtures used in office and industrial environments. Linear fluorescent fixtures such as are manufactured by Lithonia Lighting are known under the designations OPTIMAX; 2PM3N, and GT/SP which identify respectively parabolic troffer fixtures and lensed troffer fixtures which are particularly configured to drive linear fluorescent lamping of the T12 or T8 type, for example. In downlighting fluorescent fixtures, inverter units typically operate compact fluorescent lamps of varying description via the agency of nickel-cadmium batteries permanently sealed within steel enclosures.

Test switches have long been used in lighting systems including emergency lighting function such that the condition and operational worthiness of inverter units can be quickly and conveniently determined. In normal operation, a visual signal is usually provided by a light emitting diode which gives off light once the unit is connected to power. Operation of a prior test switch in this environment causes the LED to be extinguished for as long as the test is underway. Prior test switches have included manually operable switch elements which allow inverter units to be tested by reference to a visual signal, such prior test switches having taken other structural configurations than those of the test switches of the present invention and have particularly been more costly to manufacture. In particular, prior test switches of this type have included LED's and switches in completely separate housings. Other prior test switches have included separate toggle switches and panel-mounted light emitting diodes with further inclusion of structure such as PCB-mounted dome switches with PCB-mounted light emitting diodes. Essentially all such prior devices use a dedicated switch such as a PCB-mounted dome switch to complete a circuit. A particular feature of the present test switches which yield substantial utility in manufacture and assembly is the provision of a switch housing which can essentially be unitarily formed from a polymeric material and which houses an LED and a contact which can be brought into engagement with leads of the LED to provide a visual signal evidenced by continuing lamp operation at reduced output to indicate proper inverter operation. The LED is actually shorted and goes out. The structure so envisioned can be rapidly assembled from a minimum of parts, the resulting structure being capable of remote disposition, for example, a few feet or so, from the inverter unit and lighting fixture so that testing is facilitated. The present invention therefore provides improved test switch assemblies which also include connector structure tied to the switch housing for mounting of the test switch to a portion of the lighting fixture. The assemblies of the present invention also provide structure capable of mounting into a variety of materials such as castings, sheet metal, plastic, etc., over a range of thicknesses with ease and rapidity. The invention thus contemplates improvement over the prior art by way of providing an inexpensive and compact structure having a minimum of parts and which is readily manufactured and assembled at minimum cost.

SUMMARY OF THE INVENTION

The invention provides embodiments of a test switch and mounting assembly which is particularly useful as a manual switch to determine the condition of an inverter unit used to, provide an emergency lighting capability in fluorescent lighting fixtures. In both linear and downlighting fluorescent lighting fixtures, an emergency capability is provided by means of a sealed inverter housing containing batteries capable of driving fluorescent lamping at a fractional output of full lumen rating to yield optimum, glare-free emergency illumination for a minimum period of time on interruption of normal AC mains power. Inverter units useful in such applications are manufactured and marketed by Lithonia Lighting, a division of National Service Industries, Inc., of Atlanta, Ga., certain examples of the inverter units manufactured by Lithonia being proprietary and being the subjects of U.S. Pat. Nos. 5,202,608 and 5,814,971, the disclosures of which patents are incorporated hereinto by reference. Inverter units useful for providing an emergency lighting capability to both linear and downlighting fluorescent fixtures are marketed by Lithonia Lighting under the trademark designation of POWER SENTRY.

The batteries contained within inverter units must be capable of being tested periodically in order to ascertain the condition of the batteries, that is, to determine whether the batteries are sufficiently charged to possess the capability of driving lamping during an emergency occasioned by a power failure. Testing of associated inverter circuitry is also necessary. Embodiments of manually operable test switches configured according to the invention replace conventional test switches used in a similar manner to determine the operational worthiness of inverter units as has been described herein. The present test switches can be inexpensively manufactured relative to the cost of prior switches while retaining all capabilities of prior switches. In manufacture of the present switches, fewer parts are required and those parts can be individually manufactured at reduced cost. Assembly of the several component parts of the present test switches can be more rapidly accomplished in a typical manufacturing environment than those switches of the prior art which are replaced by the present test switches.

The present test switches are provided with polymeric housings, typically clear, "plastic" housings having opposing housing portions joined together along one edge for movement relative to each other in the manner of a "living hinge" such that the housing portions can be snapped together once internal switch components have been placed inside the housing. The housings of the present switches are further provided with a connector held to the housing by means of a connecting tie integrally formed of plastic material and molded with the housing and the connector simultaneously. Lengths of cable connect a light emitting diode disposed internally of any one of the several housings, exterior ends of the cable being electrically connected to a molded connector formed of plastic material, the molded connector having internally disposed electrical contacts which mate with contacts located within an inverter unit. The inverter unit is provided with an opening through which a conventional electrical harness extends, the harness having a mating connector which joins to the test switch of the invention in order to form an electrical circuit with internal circuit elements of one of the inverter units.

According to the several embodiments of the invention, a substantially box-like housing has a cylindrical housing element formed at one end thereof, the cylindrical housing element receiving a plastic plunger element which can be biased downwardly by finger pressure exerted against portions of the plunger which extend from the cylindrical housing element. Displacement of this plunger causes an electrical contact to complete a circuit with leads emanating from the light emitting diode and joined to the electrical cables which connect with elements to be tested disposed internally of one of the inverter units through the connector mentioned above. The light emitting diode is thus de-energized and the fluorescent tamping is caused to operate at a reduced output, thereby providing an indication of the operational worthiness of the inverter unit. In the event that the condition of the inverter unit is inadequate to provide the necessary emergency lighting function, the fluorescent tamping will not illuminate on operation of the test switch. The test switch can be mounted at a distance from the inverter unit by means of the connector which is integrally forimed with the housing of the test switch, the test switch thus being mountable to portions of the lighting fixture per se or to other structure convenient for access to the test switch for testing purposes.

Accordingly, it is a primary object of the invention to provide a manually operable test switch useful in the testing of an inverter unit installed on a fluorescent lighting fixture to provide emergency lighting capabilities to the fixtures on interruption of normal AC power.

It is another object of the invention to provide a test switch capable of providing a visual test of the operational worthiness of an inverter unit or the like, which switch structures are formed of a minimum of inexpensive parts which can be assembled with relative ease in order to reduce manufacturing expense.

It is a further object of the invention to provide a test switch which causes lamping to be illuminated at reduced levels to indicate the condition of an inverter unit, the test switch structures employing an electrically conductive element displaceable into contact with leads extending from the lamping and which are electrically connected to cables electrically joined to circuitry elements to be tested, a spring-loaded electrical contact being displaced into contact with leads joined to the lamping on manual manipulation of the plunger element against spring loading.

Other objects and advantages of the invention will become more readily apparent in light of the following detailed description of the preferred embodiments.

DESCRIPTION OF THE PREFERRED EMBODIMENTS

Figure 1:
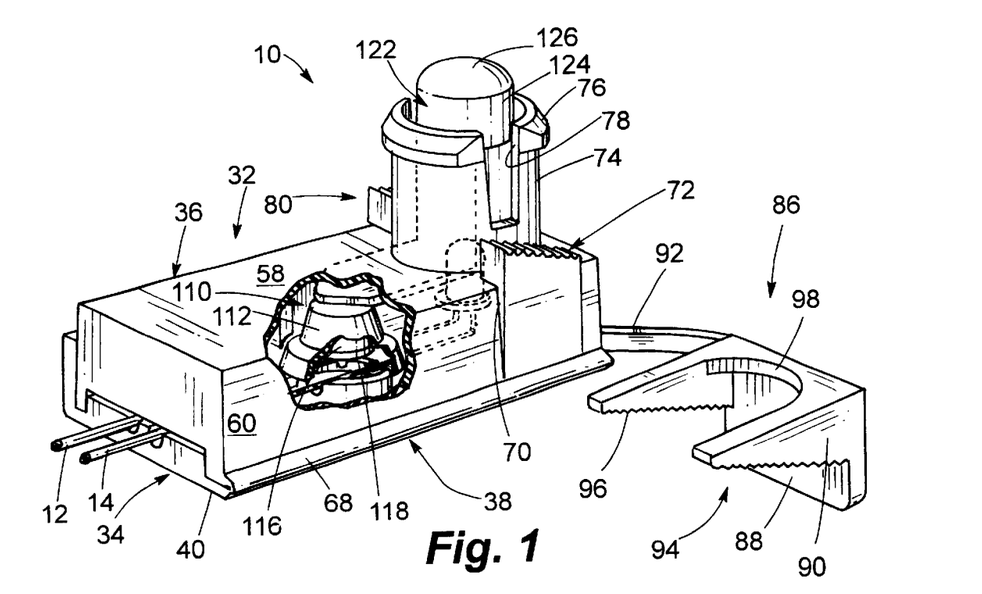
FIG. 1 is a perspective view of the preferred embodiment of the test switch.
Figure 2:
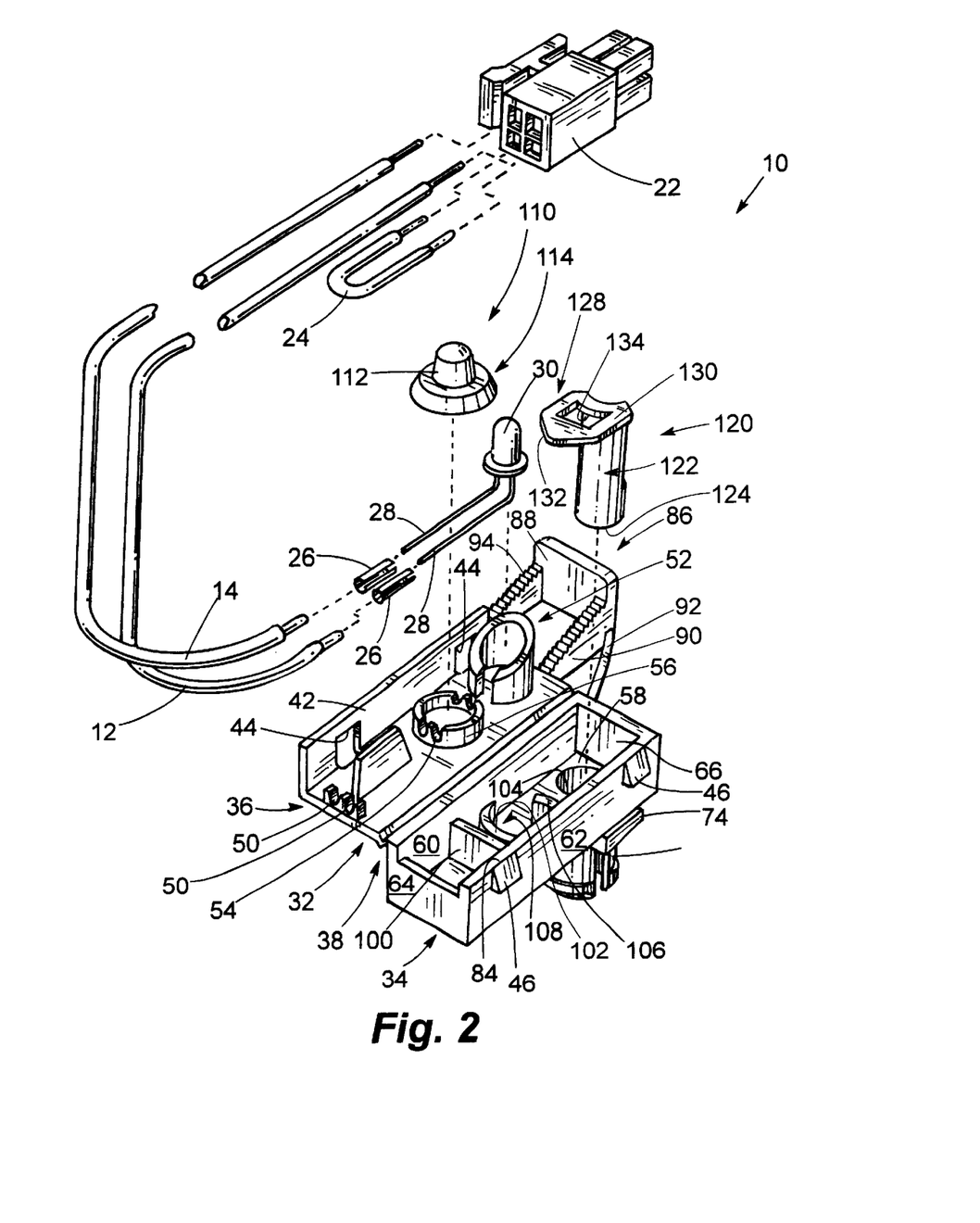
FIG. 2 is an exploded view of the preferred test switch and further showing a toothed wedge which provides a mounting function.

Referring now to the drawings and particularly to FIGS. 1 and 2, a test switch configured according to a preferred embodiment of the invention is seen generally at 10 to be fitted with insulated, electrically conductive wires 12 and 14 which are preferably formed of 18 or 20 gauge material and which are UL 1015 or 1007 rated. The wires 12, 14 perform conventional functions and are of a length, such as approximately 36 inches, which allow remote location of the test switch 10 relative to an inverter unit (not shown) with which the test switch 10 is used. The inverter unit can take the form of one of the POWER SENTRY products of Lithonia Lighting, a division of National Service Industries, Inc., of Atlanta, Ga., and contains circuit elements (not shown) sealed within the interior of the inverter unit. Batteries (not shown) which are often used in such inverter units preferably take the form of sealed, maintenance-free, high-temperature nickelcadmium batteries which are permanently sealed within housings (not shown) formed either of high-impact polycarbonate material or a conventional steel material. The inverter unit also contains a circuit board (not shown) including a charger circuit (not shown) necessary for converting 120 VAC or 277 VAC from building power to a current and voltage the batteries or other emergency power source require when building power is present, and an inverter circuit (not shown) for transforming battery voltage and current into the type of power fluorescent lamps (not shown) want to see when building power is not present. The inverter unit is conventionally mounted to a portion of a lighting fixture (not shown), the function of the inverter unit, fixture and lamp being conventional in the art in that the lamp mounted by the fixture is driven under normal conditions by AC mains power. An interruption in the primary AC power supply causes a switching of power by circuitry components (not shown) within the inverter unit to cause the lamp (and other lamping associated with the fixture) to be driven by battery power from the inverter unit. The lamp typically takes the form of a linear fluorescent lamp such as a T12 or T8 lamp when the fixture is a linear fluorescent fixture. When the fixture is a downlighting fluorescent fixture, the lamp would normally take the form of a compact fluorescent lamp or lamps of varying description.

The free ends of the wires 12, 14 are received by a connector 22 of conventional design, the connector 22 typically being of a type such as is provided by Molex under product designation 39-43025-0400. Female terminals (not shown) connect the ends of the wires 12, 14 to the connector 22 internally thereof The connector 22 plugs into the inverter unit in a conventional manner although it is important to note that the connector 22 electrically communicates with battery power within the inverter unit such that a circuit can be formed through the wires 12, 14 to the test switch 10 when the test switch is activated as will be described hereinafter. A jumper wire 24 is mounted to the connector 22 in a conventional manner and functions in a known manner which does not need to be described herein.

The ends of the wires 12, 14 opposite connection to the connector 22 are electrically spliced to crimped connectors 26 with one of the connectors 26 being connected to each end of each of the wires 12, 14. The connectors 26 connect also to respective leads 28 which form a part of a light emitting diode 30, the light emitting diode 30 being a conventional LED such as is manufactured by SUNLED Co. with product designation LMDS3D/K-14V. Other diodes produced by other companies are also useful.

The light emitting diode 30 along with the leads 28, connectors 26 and ends of the wires 12, 14 are received within a housing 32 which is molded from a clear polypropylene material or other suitable polymeric material having suitable and conventional requirements for an application of this type. The housing 32 is formed of an upper portion 34 and a lower portion 36 which are hinged together at 38 effectively by means of a "living hinge" formed along edges of the portions 34, 36. The upper and lower portions 34, 36 of the housing 32 can be pivoted relative to each other in order to form an enclosure which is the housing 32, the portions 34, 36 snapping together in a manner which will be described hereinafter.

The lower portion 36 of the housing 32 comprises a planar base 40 having a lateral planar side plate 42 which extends along an elongated edge of the planar base 40 through the full length thereof, the plane of the plate 42 being essentially perpendicular to the plane of the base 40. Two spaced rectangular openings 44 are formed in the plate 42 near each end respectively of the plate 42, the openings 44 extending through the juncture between the base 40 and the plate 42 and slightly into the base 40. The openings 44 function in concert with snap elements 46 formed integrally on the upper portion 34 of the housing 32 to lock the portions 34 and 36 together.

The planar base 40 of the lower portion 36 is provided with a divider 48 located immediately inwardly of two spaced cradling tabs 50 mounted on one edge of the base 40, the structure of the tabs 50 and of the divider 48 acting to separate the leads 28 of the test switch 10 from each other when the LED 30 and the leads 28 inter alia are placed into the interior of the housing 32, the LED 30 being placed inside of the housing 32 when the portions 34, 36 are unassembled, that is, not snapped together. The LED 30 is received within a substantially cylindrical and hollow receptacle 52 which is open on the side thereof facing the divider 48 such that the portions of the leads 28 immediately adjacent the light emitting diode 30 can be accommodated. The leads 28 are respectively received within notches 54 formed in a cylindrical wall 56 disposed between the divider 48 and the receptacle 52. Upper edges of the receptacle 52 can preferably be formed with an upward slope toward an outermost side of the receptacle 52 in order to provide increased protection to the LED 30.

The upper portion 34 of the housing 32 is substantially formed as a rectangular solid with a planar base 58 having elongated side walls 60 and 62 disposed along the longest side edges of the base 58 and side walls 64 and 66 disposed along the two shorter edges of the base 58. The side walls 60, 62, 64 and 66 are substantially planar with the planes thereof being substantially perpendicular to the plane of the base 58. A living hinge 68 is formed along the elongated side wall 60, the hinge 68 hinging the upper portion 34 and the lower portion 36 of the housing 32 together at 38 as aforesaid. The elongated side wall 60 increases in thickness to form a shoulder 70 which effectively extends above the plane of the base 58 and terminates in a slanted, toothed wedge 72 which is essentially formed integrally with a cylindrical housing 74 which extends from the base 58 at right angles thereto, the housing 72 terminating in collar portions 76 which are interrupted at opposite ends by means of rectangular notches 78 which extend from the distal end of the cylindrical housing 74 to locations just above upper surfaces of the toothed wedge 72 and a toothed wedge 80 formed on the opposite side of the housing 74 from the wedge 72, the toothed wedge 80 extending essentially directly from the base 58 and being thickened to form a shoulder 82 at the juncture of the wedge 80 and the base 58. The toothed wedges 72 and 80 provide a mounting function in concert with additional structure which will be described hereinafter.

The elongated side wall 62 is provided with the snap elements 46 as alluded to above, the elements 46 being substantially triangular in cross-section by virtue of being thicker at terminations of the elements 46 inwardly of the side wall 62 as opposed to loci of minimum thickness at the juncture of the elements 46 and the free edge 84 of the side wall 62. The snap elements 46 snap into the openings 44 in a conventional manner to hold the upper portion 34 and lower portion 36 together to form the housing 32.

A mounting yoke 86 formed of a planar base 88 having triangular legs 90, is integrally molded with the housing 32 and attached together by means of a tie 92 which is also integrally molded with the yoke 86 and the housing 32. Sloped side walls 94 are provided with teeth 96 which cooperate with the toothed wedges 72 and 80 to mount the test switch 10 to structure which can fit between side walls of the cylindrical housing 74 and a preferably arcuate wall 98 formed between the legs 90 at the juncture thereof with the base 88 of the yoke 86. The end of the housing 32 having the cylindrical housing 74 extending therefrom is preferably placed against structure to which the test switch 10 is to be mounted and the yoke 86 is brought into engagement with the housing 32 such that the teeth 96 of the legs 90 of the yoke 86 engage respectively the toothed wedges 72, 80 to wedge the test switch 10 in place relative to structure of the fixture in a conventional manner. The mounting structure thus described is adjustable by virtue of movement of the toothed sloped side walls 96 of the legs 90 of the yoke 86 relative to the toothed wedges 72, 80 so that mounting to structure of differing physical dimension can be accommodated.

A planar wall 100 is formed interiorly of the upper portion 34 of the housing 32, the wall 100 extending downwardly toward the planar base 40 of the lower portion 36 at the inward side of the divider 48 to facilitate maintenance of the leads 28 in a desired location within the interior of the housing 32. An arcuate wall 102 is formed inwardly of the wall 100 and, like the wall 100, extends from interior surfaces of the planar base 58 to a location immediately opposing outermost peripheral surfaces of the wall 56, thereby to facilitate maintenance of the leads 28 within the notches 54 formed in the wall 56. Immediately inwardly of aperture 104 which is the juncture of the housing 74 with the base 58, an arcuate tab 106 extends from inner surfaces of the base 58 and is received between the wall 56 and the receptacle 52 which extend from the base 40 of the lower portion 36 of the housing 32. The arc of the tab 106 opposes the arc of the arcuate wall 102 to incompletely defme an arcuate receptacle 108 which receives an elastomeric grommet 110 which has a substantially conical portion 112 surrounded by an apron 114 on exterior surfaces of the grommet 110. Interiorly of the grommet 110, the grommet 110 is essentially hollow except for a central, substantially cylindrical wall 116 which mounts an electrically conductive disc 118. The conical portion 112 of the grommet 110 is placed into the arcuate receptacle 108 whereby the apron 114 contacts along major portions thereof the outer peripheral edges of the arcuate wall 102 and the arcuate tab 106. A plunger 120 formed of an elongated, arcuate body portion 122 terminates in a cylinder 124 at one end of the body portion 122, the cylinder 124 being rounded to form a push button 126 which extends slightly out of the cylindrical housing 74 at the free end of said housing 74 such that the push butt 12 can be manipulated by finger pressure. The opposite end of the arcuate body portion 122 terminates in a shaped base plate 128 having a rectangular portion 130 immediately adjacent the body portion 122 and a triangular portion 132 extending from an outer lateral edge of the rectangular portion 130. An opening 134 of substantially rectangular shape is formed in the rectangular portion 130, the opening 134 being rectangular except for the side of the opening nearmost the arcuate body portion 122, this side of the opening 134 being arcuate to accommodate the shape of the body portion 122.

Assembly of the plunger 120 into the cylindrical housing 174 causes the arcuate tab 106 to be received within the opening 134 of the base plate 128 of the plunger 120, the base plate 128 then lying between interior surfaces of the planar base 58 of the upper portion 34 and the elastomeric grommet 110 although the grommet 110 is positioned to rest on the arcuate wall 102 and the arcuate tab 106 as aforesaid. Finger pressure on the push button 126 causes the plunger 120 to move inwardly of the cylindrical housing 74 and to cause the base plate 128 of the plunger 120 to displace the grommet 110 against resilient loading provided by the material from which the grommet 110 is formed. Displacement of the grommet 110 coupled with distortion of the apron 114 of the grommet 110 in particular causes the electrically conductive disc 118 to come into contact with the leads 28 of the LED 30 when the LED 30 has been mounted within the housing 32 as aforesaid. The LED 30, which has essentially been illuminated since correct wire hook-up during installation, is thus shorted out and is no longer illuminated. Indication of the operational worthiness of the unit 16 is provided by illumination of the lamping, such as the lamp 20 at reduced levels.

Figure 3:
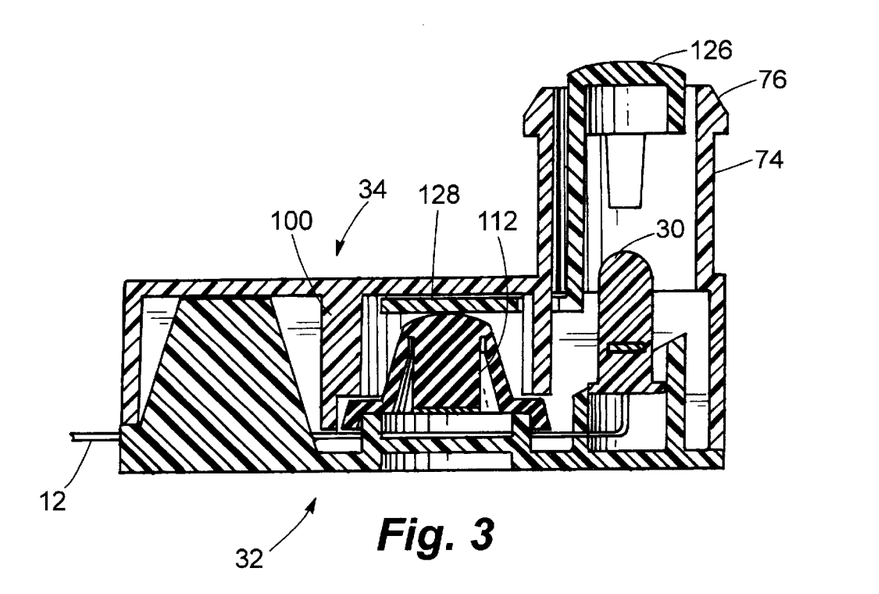
FIG. 3 is a side elevational view in section of the test switch of FIG. 2 illustrating the switch in a non-testing condition.
Figure 4:
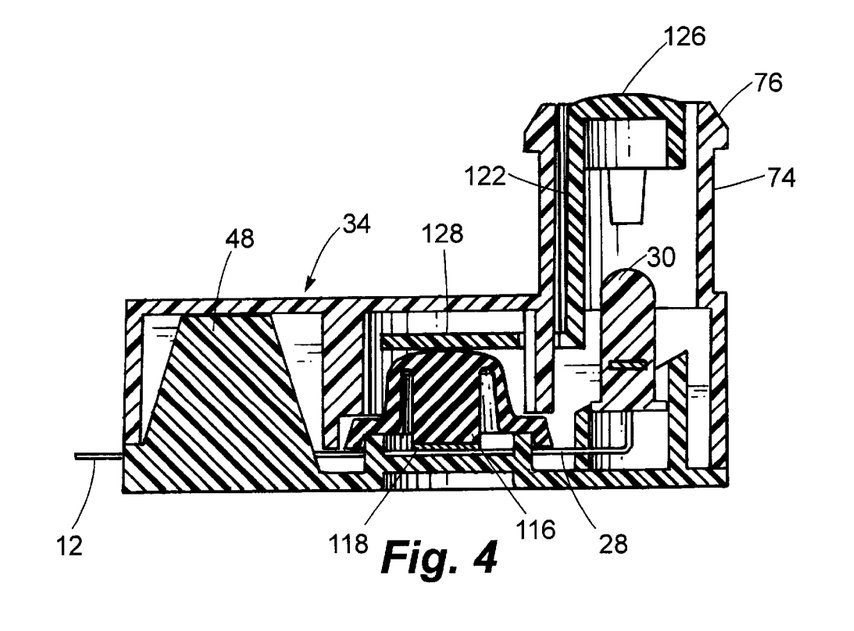
FIG. 4 is a side elevational view in section of the test switch of FIG. 2 illustrating the switch in a non-testing condition.
Figure 5:
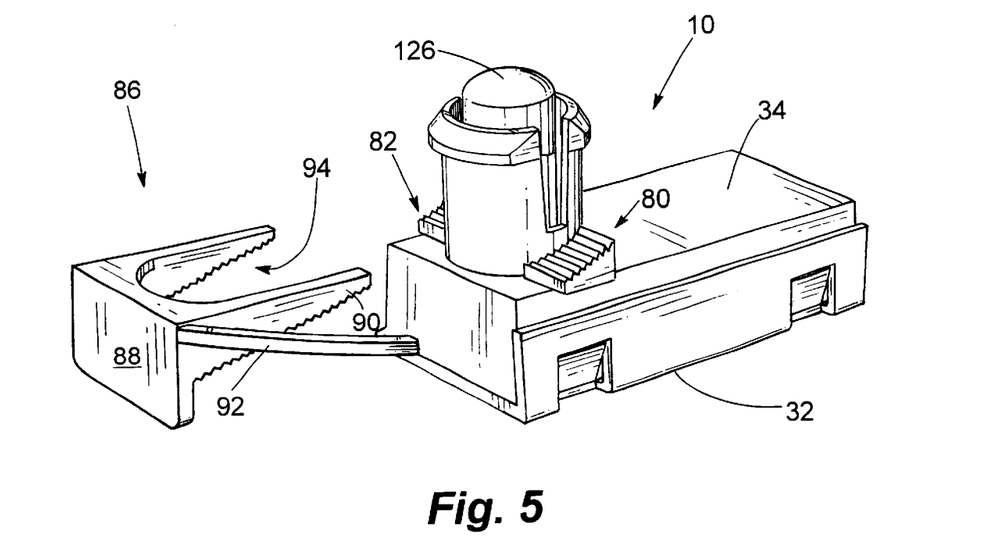
FIG. 5 is a perspective view of the test switch taken from an opposite end thereof; and, FIG. 6 is an exploded view of a second embodiment of the invention.

FIGS. 3 and 4 respectively illustrate the configuration of a non-testing and testing condition respectively of the test switch 10. FIG. 4 particularly illustrates the configuration of the structural elements of the switch 10 when the push button 126 is depressed. FIG. 5 more clearly illustrates the structure of the test switch 10 by providing a perspective view which shows the test switch from the opposite side thereof relative to the orientation of the switch as seen in FIG. 11.

Figure 6:
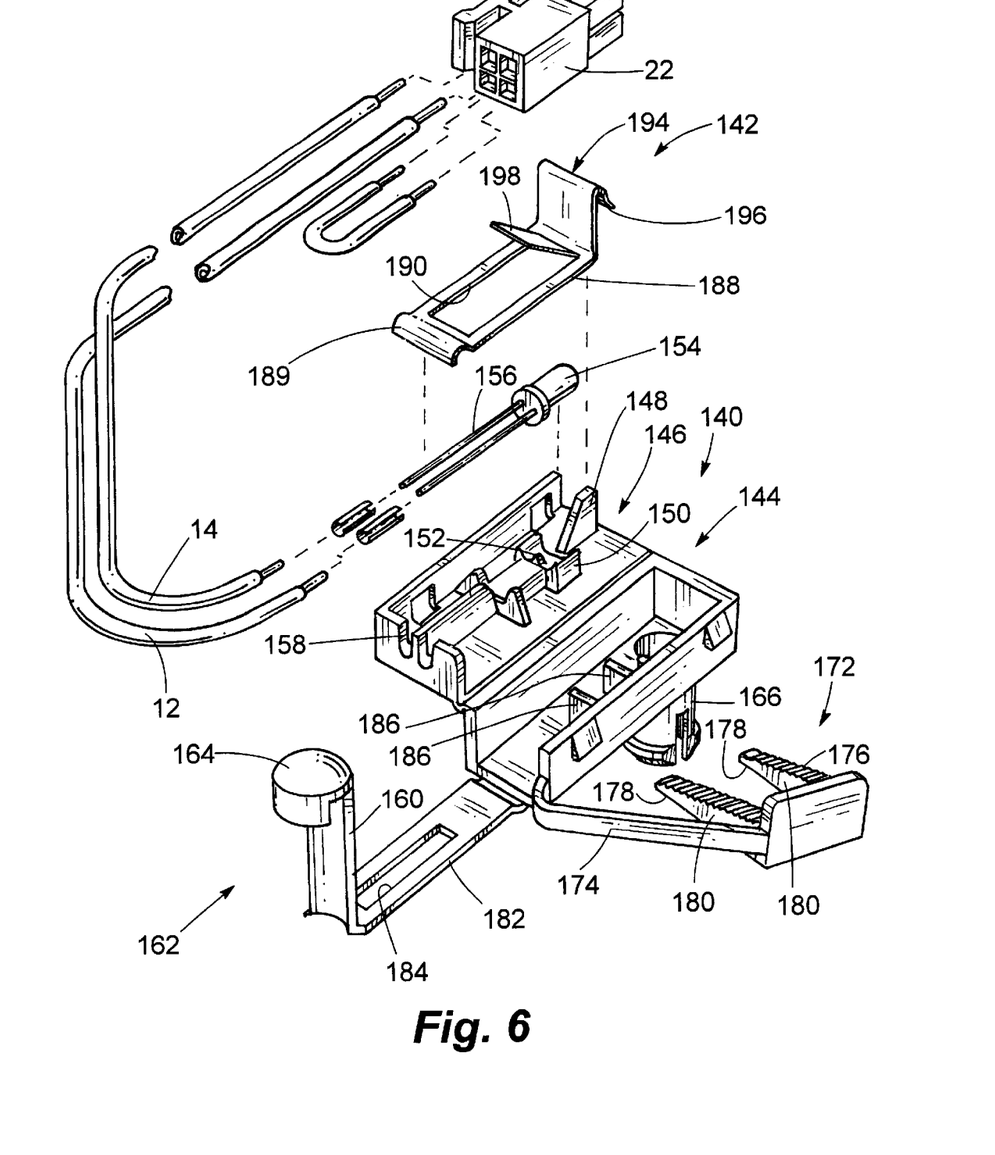

Referring now to FIG. 6, a second embodiment of the invention is seen in an exploded view to include structure similar to that described hereinabove relative to the first embodiment of the invention. Essentially, only housing 140 and an electrical contact spring 142 differs substantially from corresponding structure described relative to the first embodiment of the invention. The housing 140 is seen to be similar in external features to the housing 32 described above particularly in that the housing 140 is formed of upper and lower portions 144 and 146. The upper and lower portions 144 and 146 snap together to form the housing 140 in a manner which is substantially identical to that described hereinabove relative to the housing 32. The lower portion 146 of the housing 140 is provided interiorly thereof with a divider 148 which fmctions substantially as does the divider 48 of FIGS. 1 through 4. Further, the lower portion 146 is provided with a cradle 150 having notches 152, the cradle allowing LED 154 to lie thereon while leads 156 fit into the notches 152 formed in the cradle 150. A wall 158 at the end of the lower portion 146 opposite the divider 148 extends upwardly from a base of the lower portion 146 to provide an edge against which an actuator portion 160 of plunger 162 can bias in order to limit travel of the portion 160. The plunger is provided with a push button 164 which is essentially identical to that described hereinabove relative to the embodiment of FIGS. 1 through 4, the plunger 162 fitting within a cylindrical housing 166 which is hollow and which extends from one end of the upper portion 144 of the housing 140. The cylindrical housing 166 is formed in a manner essentially identical to that described hereinabove relative to the embodiment of FIGS. 1 through 4. However, the housing 166 is provided with toothed wedges (not shown) on either side of the housing 166 along the longitudinal axis of the housing 140. A yoke 172 held to the housing 140 by means of an integral tie 174 is essentially identical in structure to the yoke 86 shown and described hereinabove, teeth 176 formed on sloped side walls 178 of legs 180 of the yoke 86 cooperating with the toothed wedges mentioned above to provide an identical function to that described hereinabove relative to essentially identical structure of the test switch 10.

The plunger 162 is provided at its free end with an elongated pressure plate 182 which has an elongated opening 184 formed therein, the opening 184 receiving therethrough positioning stem walls 186 which extend downwardly into the interior of the housing 140 from inner surfaces of the upper portion 144. The electrical contact spring 142 is formed of an electrically conductive material and is placed within the interior of the housing 140 between the pressure plate 182 and the lower portion 146 of the housing 140. The spring 142 is formed of a base 188 having ani opening 190 formed therein, the base 188 being elongated and terminating in recurved distal tips 189. The opposite end of the base 188 is formed of a substantially U-shaped downward protrusion 194 having a recurved end portion 196. A tab element 198 extends from an innermost leg portion of the protrusion. Pressure on the push button 164 of the plunger 162 causes the pressure plate 182 to bias downwardly against spring loading provided by the geometry and material of the electrical contact spring 142 and causes a portion of the spring 142 to electrically contact the leads 156 to short the LED 154 and provide the visual indication from lamping as noted above. Accordingly, testing is readily and easily accomplished.

It is to be understood that the invention can be practiced other than as expressly shown and described herein, the scope of the invention being defined by the recitations of the appended claims.

What is claimed is:

1. A switch for testing the operational status of at least a portion of an electrical system that is to be tested, said portion having electrical leads connected to a source of power, the switch comprising:

means for indicating the operational status of the portion of said electrical system, at least a portion of the electrical leads being electrically connected to the indicating means;

means for housing the indicating means and at least a portion of the electrical leads electrically connected to the indicating means, the housing means having at least portions thereof formed of a transparent material, the indicating means being disposed within the housing means at a location therewithin whereby the indicating means is visible from exteriorly of said housing means;

means for electrically contacting the electrical leads connected to the indicating means, the electrical contact means being mounted within the housing; and, means for displacing the electrical contact means from a first position not in electrical contact with the electrical leads connected to the indicating means to a second position wherein electrical contact is effected between the electrical contact means and the electrical leads connected to the indicating means, thereby to produce a response of the indicating means indicative of the operational status of said portion of the electrical system recognizable from exteriorly of the housing means.

2. The switch of claim 1 wherein the switch is utilized to determine the condition of an inverter unit in a lighting fixture having lamping driven by normal AC power under usual conditions, the light fixture fiuther having a secondary source of power utilized during emergency conditions to power the lamping, operation of the displacing means causing electrical contact between the electrical contact means and the electrical leads connected to the indicating means to short said leads, thereby simulating a loss of power to enable testing of the inverter unit, the indicating means thereby being de-energized, the lamping being illuminated at reduced levels by agency of the secondary power source while said leads are shorted through electrical contact with the electrical contact means.

3. The switch of claim 2 wherein the inverter unit includes a power source and the power source comprises at least one battery.

4. The switch of claim 1 and further comprising means carried by and within the housing means for resiliently loading the electrical contact means, the electrical contact means returning to the first position from the second position on discontinuation of function of the displacing means, the electrical contact means being thereby disengaged from electrical contact with the leads.

5. The switch of claim 4 wherein the loading means comprise a body of elastomeric material having the electrical contact means disposed on a first portion thereof, the displacing means biasing against a second portion thereof to displace the electrical contact means into electrical contact with the leads against a force exerted by the elastomeric material acting to displace the electrical contact means from the second position to a position whereby the electrical contact means does not electrically contact the leads.

6. The switch of claim 5 wherein the electrical contact means comprise an electrically conductive disc.

7. The switch of claim 5 wherein the body of elastomeric material is formed of a body member having the electrical contact means disposed on one end thereof facing the leads within the housing means, the opposite end of the body member being contacted by the displacing means to bias the body member and the electrical contact means disposed thereon into electrical contact with the leads.

8. The switch of claim 7 wherein the body of elastomeric material is formed with a resilient apron disposed at least partially about peripheral side portions of the body member, the apron being fixed within the housing means, displacement of the body member from the first position to the second position acting to stretch the apron and resiliently load said apron whereby discontinuation of the function of the displacing means causes the resiliency of the apron to displace the body member and the electrical contact means carried thereby from the second position, the electrical contact means thereby being disengaged from electrical contact with the leads.

9. The switch of claim 1 whereby the housing means comprises a hollow body and a plunger housing open at its distal end and extending from a portion of the body, the displacing means further comprising a plunger disposed within the plunger housing for movement therewithin, a distal portion of the plunger extending from the open distal end of the plunger housing and being adapted for manual contact therewith exteriorly of the plunger housing to displace the plunger within said plunger housing, the plunger further having a pressure plate formed thereon and positioned within the body to engage the electrical contact means on displacement of the plunger to cause the electrical contact means to contact the leads.

10. The switch of claim 9 wherein the electrical contact means comprise a resiliently loaded spring element formed of electrically conductive material, the pressure plate of the plunger displacing a portion of the spring element into electrical contact with the leads on displacement of the plunger.

11. The switch of claim 9 and further comprising means for housing the indicating means within the interior of the hollow body.

12. The switch of claim 11 wherein the means for housing the indicating means is disposed within the body directly beneath the plunger housing, the plunger and the plunger housing being formed of a transparent material, the plunger being hollow, the indicating means at least partially extending into the hollow plunger, the indicating means being fixed in place within the hollow body and the plunger being displaceable relative to the indicating means.

13. The switch of claim 12 wherein the indicating means comprises a light emitting diode.

14. The switch of claim 9 wherein the pressure plate has an aperture formed therein, the switch further comprising means carried by the housing means and extending through the aperture in the pressure plate to position the plunger throughout a full range of displacement of the plunger.

15. The switch of claim 1 and further comprising means carried by the housing means for positioning the leads within the housing means.

16. The switch of claim 1 and further comprising means carried by the housing means for mounting the electrical contact means for movement between the first position and the second position.

17. The switch of claim 1 and further comprising at least two toothed wedges formed as on exterior surfaces of the housing means and a toothed yoke connector cooperable with the toothed wedges, respective teeth of the wedges and of the connector engaging to positively mount the switch to environmental structure.

18. The switch of claim 17 and further comprising a tie connecting the housing means and the toothed yoke connector, the housing means, the tie and the connector being integrally formed by molding of a polymeric material.

19. The switch of claim 1 wherein the housing means is formed of upper and lower portions, one of the portions having a hollow housing open at both ends thereof and extending therefrom, the hollow housing receiving at least a portion of the displacing means therein, the displacing means having a push button formed thereon, the push button extending at least partially from one of the open ends of the housing and exteriorly of said housing and being adapted for manual contact to bias the displacing means inwardly of the housing means to displace the electrical contact means from the first position to the second position.

20. The switch of claim 19 and further comprising means for snap-fitting the upper and lower portions of the housing means together.

21. The switch of claim 19 and further comprising means carried by one or both of the portions for positioning the electrical contact means in place and means carried by one or both of the portions for positioning the indicating means and associated leads in place.

22. The switch of claim 19 and further comprising a hinge for connecting the upper and lower portions of the housing means.

23. The switch of claim 22 wherein the upper and lower portions of the housing means and the hinge are integrally molded together from a polymeric material.

24. The switch of claim 23 and further comprising at least two toothed wedges formed on exterior surfaces of one of the portions of the housing means, the switch further comprising a toothed yoke connector cooperable with the toothed wedges, respective teeth of the wedges and of the connector engaging to positively mount the switch to environmental structure.

25. The switch of claim 24 further comprising a tie connecting one of the portions of the housing means and the toothed yoke connector, the portions of the housing means, the tie and the connector being integrally formed by molding of a polymeric material.

26. A test switch for determining the condition of an inverter unit in a lighting fixture having lamping driven by AC power during normal operation and a secondary source of power during emergency conditions when normal AC power is not available, the lighting fixture having circuitry for electrically connecting the lamping to the secondary source of power on loss of AC power or on simulation of the loss of AC power, comprising:

an indicator;

electrical leads connected to the indicator and to a source of normal AC power during availability thereof;

a housing mounting the indicator and at least a portion of the leads, the housing having a hollow extension formed therein, the hollow extension being open at a free end thereof;

an electrical contact disposed within the housing and displaceable to engage the leads of the indicator to short the leads, thereby simulating loss of power to enable testing of the inverter unit, the indicator thereby being de-energized; and, a plunger displaceable within the hollow extension, displacement of the plunger engaging the electrical contact to engage the electrical contact with the leads of the indicator, a free end of the plunger extending at least partially through a free end of the hollow extension, the free end of the plunger being adapted for manual manipulation to displace the plunger and to thereby engage the electrical contact with the leads of the indicator.

27. The test switch of claim 26 and further comprising wires joined to the leads at one end and an electrical connector joined to the wires at the opposite ends thereof, the electrical connector being connectable to the circuit containing the power source, the length of the wires permitting location of the test switch remote from the power source.

28. The test switch of claim 26 wherein the indicator is a light emitting diode.

29. The test switch of claim 26 wherein the inverter unit includes the secondary power source and the secondary power source comprises at least one battery.

30. The test switch of claim 26 and further comprising toothed wedges formed on the housing, the test switch further comprising a toothed yoked connector cooperable with the toothed wedges to mount the test switch to environmental structure.

31. The test switch of claim 30 and further comprising a tie connecting the housing and the toothed yoke connector, the housing, the tie and the connector being integrally formed by molding of a polymeric material.

32. The test switch of claim 26 wherein the electrical contact is a disc formed of electrically conductive material, and further comprising an elastomeric grommet having resiliency and mounting the disc, the plunger biasing against the grommet to cause the disc mounted by the grommet to be displaced into electrical contact with the leads.

33. The test switch of claim 26 wherein the electrical contact is an electrically conductive spring, a portion of the spring being displaced into electrical contact with the leads displacement of the plunger.

34. The test switch of claim 26 wherein the housing is formed of upper and lower portions, the upper portion having the hollow extension formed thereon and extending therefrom.

35. The test switch of claim 34 and further comprising means for snap-fitting the upper and lower portions of the housing together.

36. The test switch of claim 34 and further comprising means formed in the upper portion of the housing for locating the electrical contact in place and means formed in the lower portion of the housing for locating the indicator and associated electrical leads in place.

37. The test switch of claim 36 wherein the housing and the means formed respectively in the upper and lower portions of the housing are integrally molded together from a polymeric material.

38. The test switch of claim 37 and further comprising toothed wedges formed in one of the portions of the housing and wherein the test switch further comprises a toothed yoked connector cooperable with the toothed wedges formed on the housing to mount the test switch to environmental structures.

39. The test switch of claim 38 and further comprising a tie connecting the housing and the toothed yoke connector, the housing, the tie and the connector being integrally formed by molding of a polymeric material.

40. The test switch of claim 26 and further comprising means for spring-loading the electrical contact to disengage the contact from the leads of the indicator on discontinuation of a force biasing the plunger for displacement within the extension of the housing.

41. The test switch of claim 26 wherein the housing is formed of a transparent material.

* * * * *